(12) United States Patent
Birdsley et al.

(10) Patent No.: US 6,403,388 B1
(45) Date of Patent: Jun. 11, 2002

(54) NANOMACHINING METHOD FOR INTEGRATED CIRCUITS

(75) Inventors: Jeffrey D. Birdsley; Michael R. Bruce; Brennan V. Davis; Rosalinda M. Ring, all of Austin; Daniel L. Stone, Cedar Park, all of TX (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/755,005

(22) Filed: Jan. 5, 2001

(51) Int. Cl.[7] .......................... H01L 21/66; G01R 31/26
(52) U.S. Cl. ...................... 438/17; 438/14; 438/707; 438/710; 438/719; 438/967; 438/977; 324/500; 324/527; 324/537; 324/750; 324/751; 324/753; 324/765
(58) Field of Search ........................... 438/14, 17, 707, 438/710, 719, 967, 977; 324/500, 527, 537, 750, 751, 753, 765

(56) References Cited

PUBLICATIONS

*Fixed Pattern Probe Card*, Accuprobe. http://www.accuprobe.com/technic/pattern.htm.
*FIB: A Window Into Another World*, Micrion Corporation http://www.micrion.com/b1.html.
*Focused Ion Beam Milling System*, National Law Enforcement and Corrections Technology Center—West wysiwyg://47/http://www.nlectc.org/nlectcwr/fib.html.
*Introduction to Focused Ion Beam Systems*, Fibics Incorporated http://www.fibics.com/FIBbasics.htm.

*Primary Examiner*—John F. Niebling
*Assistant Examiner*—David A. Zarneke

(57) ABSTRACT

A system and method provides for effective analysis of an integrated circuit having silicon on insulator (SOI) structure. According to one example embodiment of the present invention, the system includes a system (e.g., a nanomachining arrangement) adapted to remove a selected portion of the backside of a semiconductor device having SOI structure, and to electrically isolate a selected portion of circuitry on the SOI semiconductor device circuitry side. The isolated circuitry then is analyzed.

20 Claims, 4 Drawing Sheets

NANOMACHINING METHOD FOR INTEGRATED CIRCUITS

FIELD OF THE INVENTION

The present invention relates generally to semiconductor devices and their fabrication and, more particularly, to semiconductor devices and their manufacture involving techniques for analyzing and debugging circuitry within an integrated circuit.

BACKGROUND OF THE INVENTION

The semiconductor industry has recently experienced technological advances that have permitted dramatic increases in circuit density and complexity, and equally dramatic decreases in power consumption and package sizes. Present semiconductor technology now permits single-chip microprocessors with many millions of transistors, operating at speeds of hundreds of millions of instructions per second to be packaged in relatively small, air-cooled semiconductor device packages. A by-product of such high-density and high functionality in semiconductor devices has been the demand for increased numbers of external electrical connections to be present on the exterior of the die and on the exterior of the semiconductor packages which receive the die, for connecting the packaged device to external systems, such as a printed circuit board.

As the manufacturing processes for semiconductor devices and integrated circuits increase in difficulty, methods for testing and debugging these devices become increasingly important. Not only is it important to ensure that individual chips are functional, it is also important to ensure that batches of chips perform consistently. In addition, the ability to detect a defective manufacturing process early is helpful for reducing the number of defective devices manufactured.

To increase the number of pad sites available for a die, different chip packaging techniques have been used. One technique is referred to as a dual in-line package (DIP), in which bonding pads are along the periphery of the device. Another technique, called controlled-collapse chip connection or flip chip packaging, uses the bonding pads and metal (solder) bumps. The bonding pads need not be on the periphery of the die and hence are moved to the site nearest the transistors and other circuit devices formed in the die. As a result, the electrical path to the pad is shorter. Electrical connections to the package are made when the die is flipped over the package with corresponding bonding pads. Each bump connects to a corresponding package inner lead. The resulting packages have a lower profile and have lower electrical resistance and a shortened electrical path. The output terminals of the package may be ball-shaped conductive-bump contacts (usually solder or other similar conductive material) and are typically disposed in a rectangular array. These packages are occasionally referred to as "Ball Grid Array" (BGA). Alternatively, the output terminals of the package may be pins, and such a package is commonly known as the pin grid array (PGA) package.

For BGA, PGA and other types of packages, once the die is attached to the package, the backside portion of the die remains exposed. The transistors and other circuitry are generally formed in a very thin epitaxially grown silicon layer on a single crystal silicon wafer of which the die is singulated from. In a structural variation, a layer of insulating silicon dioxide is formed on one surface of a single crystal silicon wafer followed by the thin epitaxially grown silicon layer containing the transistors and other circuitry. This wafer structure is termed "silicon on insulator" (SOI) and the silicon dioxide layer is called the buried oxide layer (BOX). The transistors formed on the SOI structure show decreased drain capacitance, resulting in a faster switch transistor.

The side of the die including the epitaxial layer containing the transistors and the other active circuitry is often referred to as the circuit side of the die or front side of the die. The circuit side of the die is positioned very near the package. The circuit side opposes the backside of the die. Between the backside and the circuit side of the die is single crystalline silicon and, in the case of SOI circuits, also a buried oxide layer. The positioning of the circuit side provides many of the advantages of the flip chip.

In some instances the orientation of the die with the circuit side face down on a substrate may be a disadvantage or present new challenges. For example, when a circuit fails or when it is necessary to modify a particular chip, access to the transistors and circuitry near the circuit side is typically obtained only from the backside of the chip. This is challenging for SOI circuits, since the transistors are in a very thin layer (about 10 micrometers) of silicon covered by the buried oxide layer (less than about 1 micrometer) and the bulk silicon (greater than 500 micrometers). Thus, the circuit side of the flip chip die is not visible or accessible for viewing using optical or scanning electron microscopy.

Post manufacture analysis of SOI flip chip dies having a buried oxide layer (BOX) typically is destructive for various reasons, such as a need to remove substrate from the flip chip back side in order to access the circuitry. Substrate removal can be difficult to achieve and even destructive. For instance, when too much substrate is removed, the circuitry in the die can be damaged. Analysis of SOI flip chips dies during and after manufacture by nondestructive methods adds to the efficiency of the whole process, in that problems are discovered early and solutions are effected with minimal delays. Thus, there is an unmet need for a method of analyzing and testing flip chip BOX die circuit operations without necessarily destroying the die.

SUMMARY

The present invention is directed to a method and system for analyzing a semiconductor device having SOI structure where it is desired to electrically isolate a portion of the device circuitry. The present invention is exemplified in a number of implementations and applications.

According to one such example embodiment, a nanomachining system is used to remove a selected portion of the backside of a semiconductor device having silicon on insulator (SOI) structure. A selected portion of the circuitry is electrically isolated and analyzed for integrity. In this manner, difficulties associated with flip chip analysis, such as those discussed above can be addressed.

The above summary is not intended to describe each illustrated embodiment or every implementation of the present invention. The figures and detailed description which follow more particularly exemplify these embodiments.

BRIEF DESCRIPTION OF THE DRAWINGS

The invention may be more completely understood in consideration of the following detailed description of various embodiments of the invention in connection with the accompanying drawings, in which.

Figure 1:
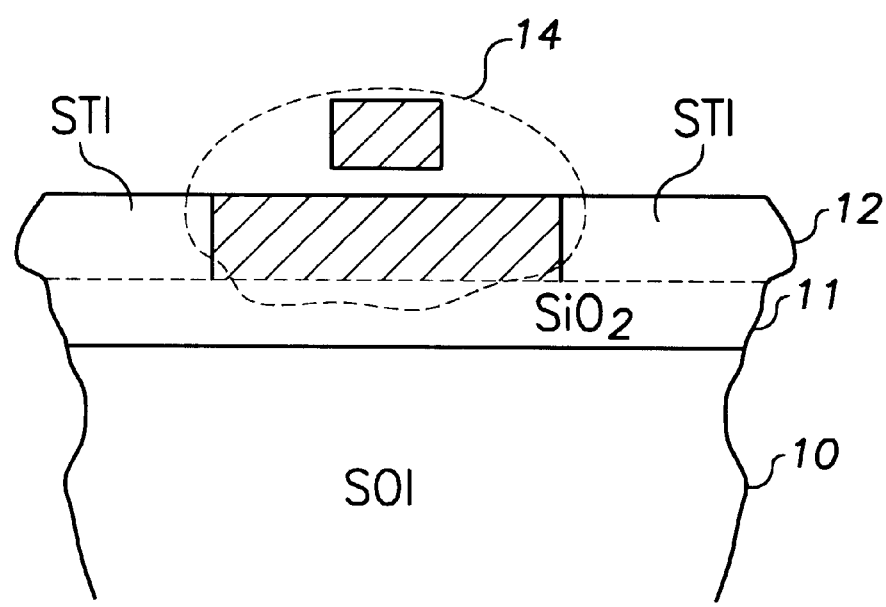
FIG. 1 illustrates the general structure of a SOI transistor, suitable for use in connection with an example embodiment of the invention described herein.

While the invention is amenable to various modifications and alternative forms, specifics thereof have been shown by way of example in the drawings and will be described in detail. It should be understood, however, that the intention is not necessarily to limit the invention to the particular embodiments described. On the contrary, the intention is to cover all modifications, equivalents, and alternatives falling within the spirit and scope of the invention as defined by the appended claims.

DETAILED DESCRIPTION

The present invention is believed to be applicable for a variety of different types of semiconductor devices, and the invention has been found to be particularly suited for back-side analysis and testing silicon on insulator (SOI) integrated circuits. FIG. 1. Illustrates an example SOI transistor in a structure including a back-side 10 over which an $SiO_2$ layer 11 is formed to act as an insulator between a thin layer of silicon 12 in which a transistor 14 is formed. While the present invention is not necessarily limited to such SOI devices, various aspects of the invention may be appreciated through a discussion of various examples using this context.

In an example embodiment of the present invention, a nanomachining system is adapted to electrically isolate a selected portion of circuitry in a SOI semiconductor device circuitry side. A suitable removal device, such as a focused ion beam (FIB) arrangement, is adapted to remove a selected portion of the semiconductor device in a manner that isolates a portion of circuitry in the device, and the isolated circuitry then is analyzed.

Figure 2:
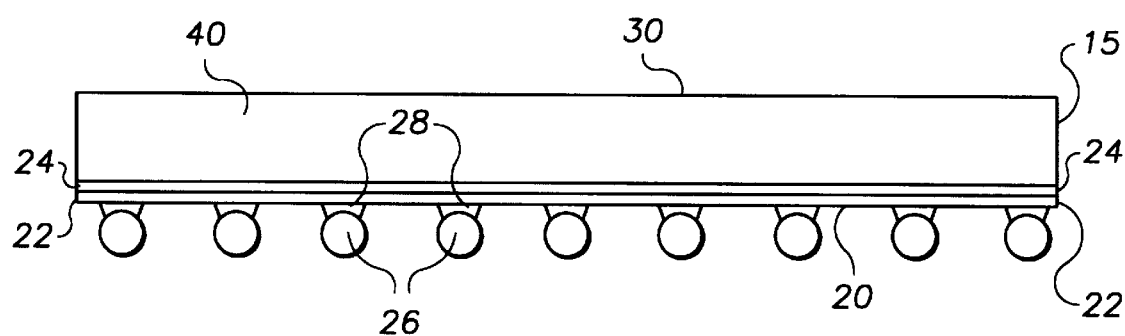
FIG. 2 illustrates a SOI flip chip in cross section, suitable for use in connection with another example embodiment of the invention described herein.

FIG. 2 shows a side view of a SOI flip chip type die 15 having a circuit side 20 and a backside 30. As described in the background discussion, the flip chip design has a packaging portion (not shown) that covers the circuit side 20, leaving only the back side readily accessible. The circuit side 20 includes a number of circuit devices formed near the circuit side in a portion of the die referred to as the epitaxial layer 22. The epitaxial layer 22 has a thickness in the range of 1 to 15 micrometers. Supporting the epitaxial layer 22 is the buried oxide layer (BOX) 24, which has a thickness in the range of less than 1 micrometer. The portion of the SOI die shown above the buried oxide layer 24 will be referred to as the bulk silicon layer 40. A plurality of contacts, such as solder bumps 26, is made on the circuit side 20 at pads 28. These contacts are the inputs and outputs to the circuitry associated with the SOI flip chip die 15. The die 15 may be attached to other devices, such as a package for a flip chip, via the solder bumps on the die 15. Due to the contacts being present on the circuit side 20, access to the circuit side 20 is typically achieved from the backside 30 through the bulk silicon layer 40.

Figure 3:
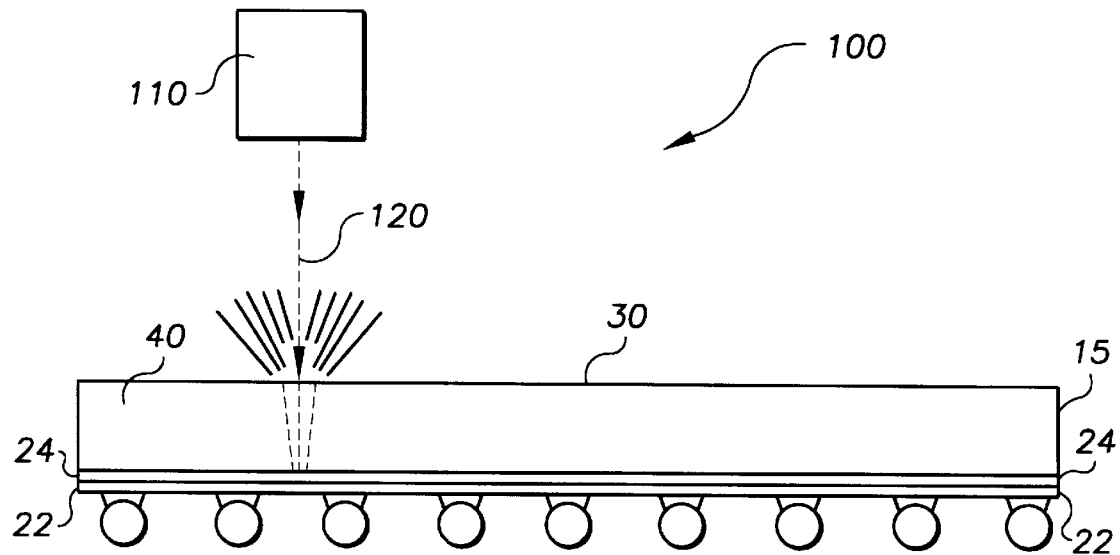
FIG. 3 illustrates a SOI flip chip receiving nanomachining to remove a portion of the chip backside, consistent with another example embodiment of the invention described herein.

FIG. 3 shows a nanomachining system 100 for analyzing an integrated circuit die 15 having SOI structure, according to an example embodiment of the present invention. The nanomachining system 100 is adapted to remove a selected portion of the backside 30 of a semiconductor device having SOI structure. A substrate removal arrangement 110 generates a focused ion beam 120. The arrangement 110 is aligned to direct the ion beam 120 at the backside 30 of the SOI die 15. The ion beam 120 removes a selected portion of the backside 30 of the SOI die 15, stopping short of the buried oxide layer (BOX) 24 and supported circuitry, thereby forming an exposed region. The ion beam 120 is controlled and stopped before penetrating the BOX 24 using, for example, a stage current endpointing tool or contrast collection of secondary ions and electrons during milling.

Due to the small dimensions of the SOI flip chip device, an ion beam of femtosecond pulsing is used in order to produce a cut with edges as nearly vertical as possible. One commonly used ion beam suitable for use in connection with the present invention is a beam of gallium ions operated at a high beam current for site specific milling. Additionally, a reactive gas contained near the chip backside during ion beam milling can be used to hasten removal of the substrate material. A commercially available focused ion beam device is the Micrion 9800 available from Micrion Corporation, Peabody, Mass.

Figure 4:
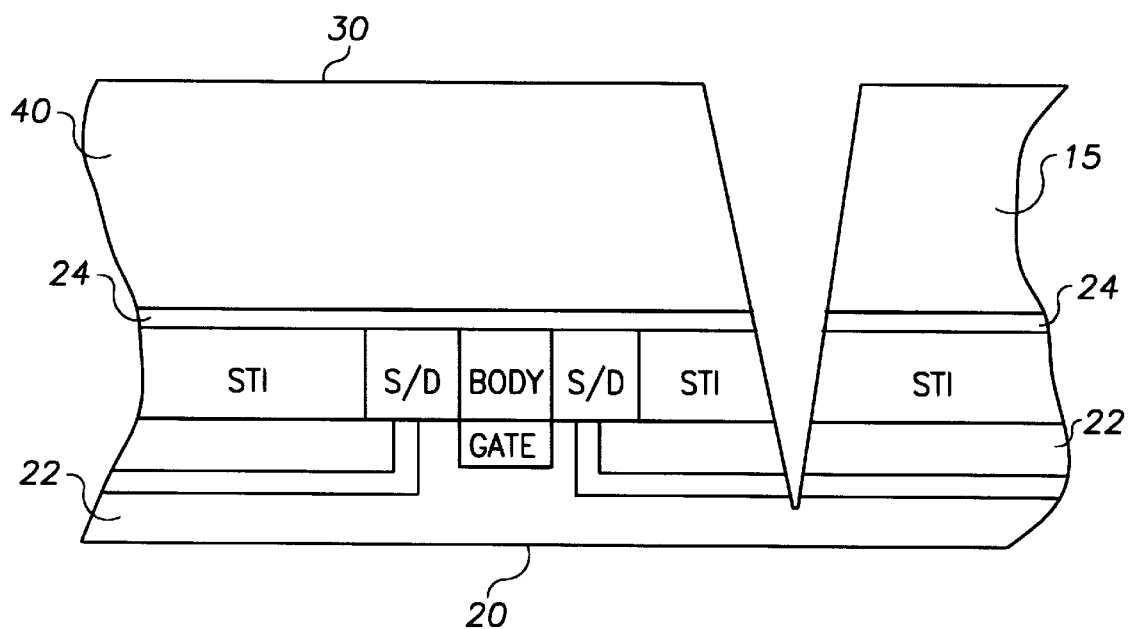
FIG. 4 illustrates a SOI flip chip in cross section after nanomachining, consistent with another example embodiment of the invention described herein.
Figure 5:
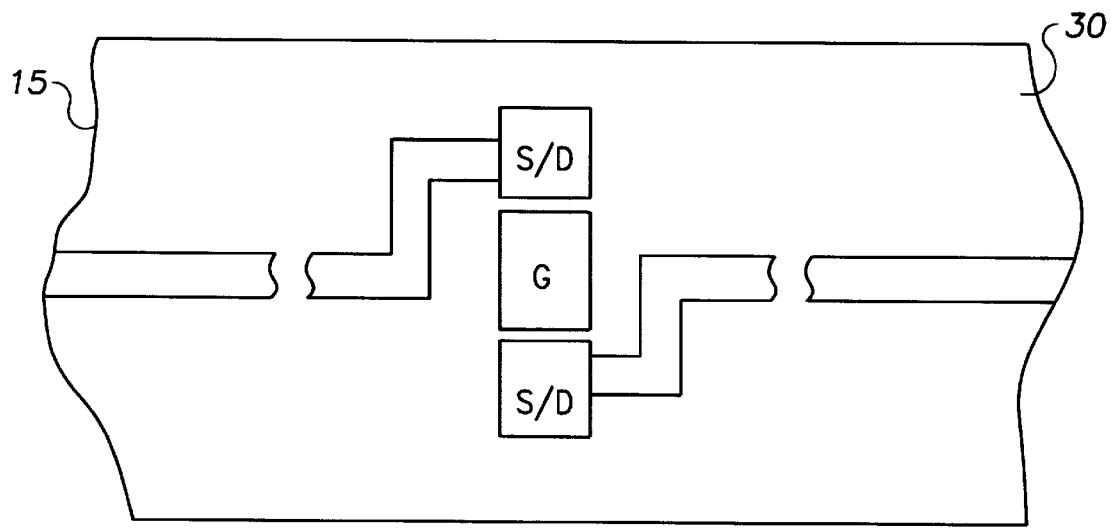
FIG. 5 illustrates a SOI flip chip top view after nanomachining, consistent with another example embodiment of the invention described herein.

Once the selected portion of the backside 30 is removed from the SOI flip chip integrated circuit 15, the ion beam 120 is directed at a selected circuitry portion in the exposed region of the SOI flip chip 15, such as a transistor. The beam is employed to sever the electrical connections of the selected circuitry portion from the remainder of the circuitry, such as represented in FIG. 4. This may require removing the remaining backside 30 and the buried oxide layer 24 from one or more areas of the exposed region already milled, before severing the electrical connections of the circuitry portion of interest. Again, due to the small dimensions of the SOI flip chip device circuitry components, an ion beam of femto-second pulsing is used in order to produce a cut with edges as nearly vertical as possible, and avoid any adjacent circuitry. The focused nature of the ion beam imposes a minimal intrusion on the area of interest on the SOI flip chip 15. The circuitry component of interest in the exposed region is thus electrically isolated from the remainder of the circuitry on the SOI flip chip 15, as represented in FIG. 5, where severing interconnect lines on each side of a transistor isolate that portion of circuitry.

The electrically isolated component is then analyzed for integrity, as well as for other operational parameters that are appropriate. In order to analyze the isolated component, the component electrical contacts are provided with suitable stimulation, such as heat or electrical stimulus. The isolated component may be stimulated using various devices, such as a laser, a probe card, a test fixture or other probe devices. One means of providing electrical stimulus is by use of an Alessi programmable micropositioner wafer probe station, commercially available from Cascade Microtech, Inc. of Beaverton, Oreg.

Figure 6:
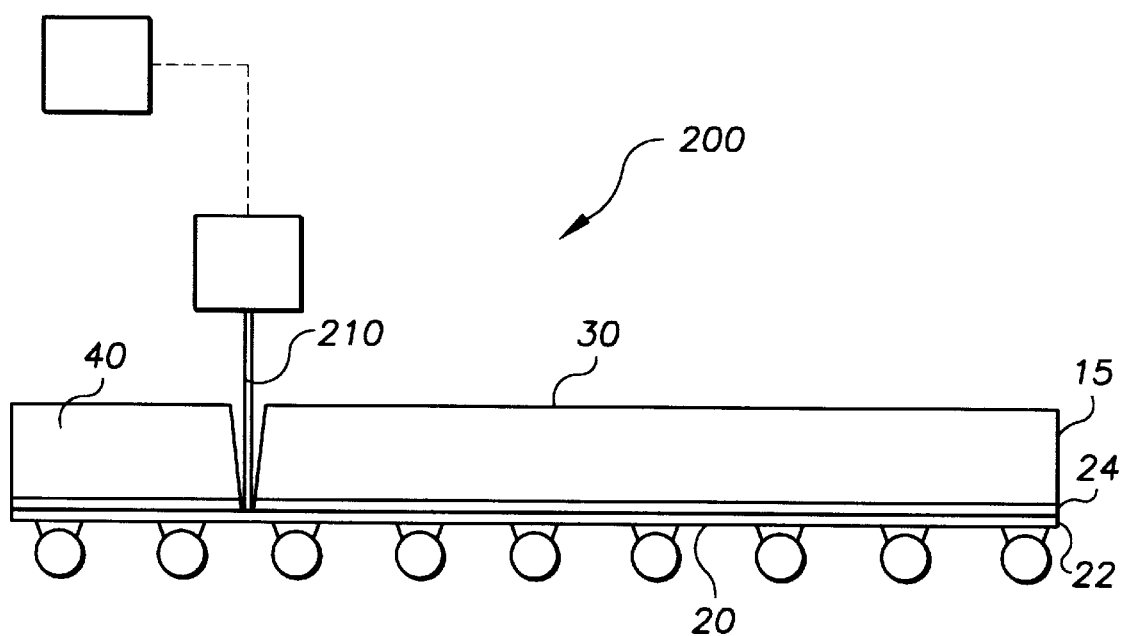
FIG. 6 illustrates a SOI flip chip after nanomachining and during analysis, consistent with another example embodiment of the invention described herein.

FIG. 6 shows the flip chip 15 being probed, according to another example embodiment of the present invention. A probe system 200 employs micro electrical contacts 210 that are coupled to the circuitry connections of the isolated component of the flip chip device 15. The microprobe system 200 shown in FIG. 6 is connected to the electrically isolated component through the backside of the flip chip die 15. Electrical stimulus is applied to the isolated component, and a response from the component is detected and used to analyze the component. Such application of stimulation or response detection from the isolated component can involve the use of typical analyzing devices 220, such as power supply, a test fixture, a computer, a signal detection device or a laser.

In one example implementation, a focused ion beam is employed to establish connection to the component electrical contacts. Conductors are deposited extending from the contacts using the focused ion beam to decompose a metal-containing gas contained near the component of interest. An analysis device 220, such as a signal detector or a power source, is coupled to the conductors and used to analyze the isolated component.

In another example embodiment of the present invention, the isolated selected circuitry portion is reconnected to the remainder of the circuitry. Conductors are deposited to electrically reconnect the isolated circuitry, for example, by using a focused ion beam to decompose a metal-containing gas contained near the circuitry of interest.

While the present invention has been described with reference to several particular example embodiments, those skilled in the art will recognize that many changes may be made thereto without departing from the spirit and scope of the present invention, which is set forth in the following claims.

What is claimed is:

1. A method for analyzing a silicon on insulator (SOI) semiconductor device having at least two layers including circuitry in a circuit side opposite a backside, the method comprising:

using a femto-second focussed ion beam;
removing a selected portion of the SOI semiconductor device backside, and
electrically isolating a selected portion of circuitry in the SOI semiconductor device circuit side; and
analyzing the electrically isolated circuitry selected portion.

2. The method of claim 1, wherein analyzing the isolated circuitry includes making electrical connection by direct coupling.

3. The method of claim 1, wherein removing a selected portion of the SOI semiconductor device backside includes using a nanomachining system.

4. The method of claim 3, wherein using a nanomachining system includes applying the femto-second focused ion beam.

5. The method of claim 1, wherein electrically isolating the selected circuitry portion includes using of a focused ion beam.

6. The method of claim 1, wherein analyzing the electrically isolated circuitry selected portion includes connecting the isolated circuitry to an electrical power source.

7. The method of claim 1, wherein analyzing the electrically isolated circuitry selected portion includes connecting the isolated circuitry to a microprobe that provides an electrical power source.

8. The method of claim 1, wherein analyzing the electrically isolated circuitry selected portion includes ion beam fabrication of conductive metal lines between the electrically isolated circuitry selected portion and an electrical power source.

9. The method of claim 1, further including reconnecting the electrically isolated selected portion of circuitry to the SOI semiconductor device circuitry.

10. An arrangement for analyzing a silicon on insulator (SOI) semiconductor device having at least two layers including circuitry in a circuit side opposite a backside, the method comprising:

means for applying a femto-second focused ion beam, and
removing a selected portion of the SOI semiconductor device backside, and
electrically isolating a selected portion of circuitry in the SOI semiconductor device circuit side; and
means for analyzing the electrically isolated circuitry selected portion.

11. A system for analyzing a silicon on insulator (SOI) semiconductor device having at least two layers including circuitry in a circuit side opposite a backside, the system comprising:

a substrate removal arrangement, including a femto-second focused ion beam generator, adapted to remove a selected portion of the SOI semiconductor device backside, and to electrically isolate a selected portion of circuitry on the SOI semiconductor device circuit side; and
an analysis arrangement adapted to analyze the electrically isolated circuitry selected portion.

12. The system of claim 11, wherein the substrate removal arrangement for substrate removal comprises a focused ion beam.

13. The system of claim 11, further comprising means for establishing a connection to exposed circuitry.

14. The system of claim 11, further comprising means for establishing a connection between circuit components in the device.

15. The system of claim 11, wherein the substrate removal arrangement for circuitry isolation comprises a femto-second focused ion beam.

16. The system of claim 11, wherein the substrate removal arrangement for substrate removal and for circuitry isolation are one and the same.

17. The system of claim 11, wherein the analyzing arrangement includes a microprobe device for analyzing the electrically isolated circuitry selected portion.

18. The system of claim 17, wherein the microprobe device is at least one of: a power supply, a test fixture, a computer, a signal detection device and a laser.

19. The system of claim 17, wherein the microprobe device is a computer.

20. The system of claim 17, wherein the microprobe device is at least one of a signal detection device and a laser.

* * * * *

UNITED STATES PATENT AND TRADEMARK OFFICE
CERTIFICATE OF CORRECTION

PATENT NO.    : 6,403,388 B1
DATED         : June 11, 2002
INVENTOR(S)   : Birdsley et al.

It is certified that error appears in the above-identified patent and that said Letters Patent is hereby corrected as shown below:

<u>Drawings,</u>
Figure 6, please label the top square box as 220.

<u>Column 5,</u>
Line 49, delete "of" so that the claim reads -- using a focused ion beam --.

Signed and Sealed this

Tenth Day of September, 2002

Attest:

Attesting Officer

JAMES E. ROGAN
*Director of the United States Patent and Trademark Office*